United States Patent
Ku et al.

(10) Patent No.: US 10,546,616 B2
(45) Date of Patent: Jan. 28, 2020

(54) ADJUSTABLE STORAGE DEVICE CARRIER

(71) Applicant: QUANTA COMPUTER INC., Taoyuan (TW)

(72) Inventors: Ming-Lun Ku, Taoyuan (TW); Chao-Jung Chen, Taoyuan (TW); Yaw-Tzorng Tsorng, Taoyuan (TW); Chen-Chien Kuo, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 6 days.

(21) Appl. No.: 16/042,796

(22) Filed: Jul. 23, 2018

(65) Prior Publication Data
US 2019/0237110 A1    Aug. 1, 2019

Related U.S. Application Data

(60) Provisional application No. 62/623,703, filed on Jan. 30, 2018.

(51) Int. Cl.
*G06F 1/16* (2006.01)
*G11B 33/12* (2006.01)
*G06F 1/18* (2006.01)
*H05K 7/14* (2006.01)

(52) U.S. Cl.
CPC ............ *G11B 33/124* (2013.01); *G06F 1/187* (2013.01); *H05K 7/1401* (2013.01); *G06F 1/16* (2013.01)

(58) Field of Classification Search
None
See application file for complete search history.

(56) References Cited

U.S. PATENT DOCUMENTS

| | | | | |
|---|---|---|---|---|
| 5,682,291 A | * | 10/1997 | Jeffries | G06F 1/184 312/223.2 |
| 5,943,208 A | * | 8/1999 | Kato | G06F 1/184 248/222.11 |
| 6,419,499 B1 | * | 7/2002 | Bundza | H05K 7/1451 439/377 |
| 7,108,530 B2 | * | 9/2006 | Kimura | G06K 7/0013 361/755 |

(Continued)

FOREIGN PATENT DOCUMENTS

| | | |
|---|---|---|
| EP | 3232296 A1 | 10/2017 |
| EP | 3244415 A1 | 11/2017 |

(Continued)

OTHER PUBLICATIONS

Extended European Search Report for EP Application No. 19150238.4, dated Jun. 24, 2019.

(Continued)

*Primary Examiner* — Courtney L Smith
*Assistant Examiner* — Rashen E Morrison
(74) *Attorney, Agent, or Firm* — Nixon Peabody LLP; Zhou Lu

(57) ABSTRACT

The present disclosure is directed to a 2.5-inch storage device carrier suitable for accommodating different thicknesses of 2.5-inch storage devices. A rotatable storage device holding element is provided with multiple bearing surfaces of differing heights to come into contact with storage devices of different thicknesses and securely hold the storage device within the storage carrier.

16 Claims, 3 Drawing Sheets

(56) References Cited

U.S. PATENT DOCUMENTS

| | | | | |
|---|---|---|---|---|
| 8,406,003 B2* | 3/2013 | Zhang | ............ | G06F 1/187 |
| | | | | 361/679.39 |
| 8,456,832 B1 | 6/2013 | Brigham, Jr. et al. | | |
| 8,854,805 B2* | 10/2014 | Dunham | ............ | G06F 1/183 |
| | | | | 361/679.33 |
| 9,629,275 B1* | 4/2017 | Beall | ............ | G11B 33/128 |
| 9,648,775 B2* | 5/2017 | Chen | ............ | F16M 13/02 |
| 9,652,001 B2* | 5/2017 | Wang | ............ | G11B 33/027 |
| 9,763,353 B1* | 9/2017 | Beall | ............ | H05K 7/1488 |
| 10,074,403 B2* | 9/2018 | Chen | ............ | G11B 33/022 |
| 2011/0005068 A1* | 1/2011 | Zhang | ............ | G06F 1/187 |
| | | | | 29/729 |
| 2012/0299453 A1* | 11/2012 | Dunham | ............ | G06F 1/183 |
| | | | | 312/244 |
| 2014/0078665 A1 | 3/2014 | Yu et al. | | |

FOREIGN PATENT DOCUMENTS

| | | |
|---|---|---|
| JP | S57-61605 U | 4/1982 |
| TW | 456562 U | 9/2001 |
| TW | 201308318 A1 | 2/2013 |

OTHER PUBLICATIONS

JP Office Action for Application No. 2019-002113, dated Jun. 4, 2019, w/ First Office Action Summary.
TW Office Action for Application No. 107135305, dated Oct. 17, 2019, w/ First Office Action Summary.
TW Search Report for Application No. 107135305, dated Oct. 17, 2019, w/ First Office Action.

* cited by examiner

ADJUSTABLE STORAGE DEVICE CARRIER

CROSS-REFERENCE TO RELATED APPLICATIONS

This application claims priority to and the benefit of U.S. Provisional Patent Application No. 62/623,703, entitled "ADJUSTABLE STORAGE DEVICE CARRIER" and filed Jan. 30, 2018, the contents of which are herein incorporated by reference in their entirety as if fully set forth herein.

FIELD

The present disclosure is directed to a 2.5-inch storage device carrier suitable for accommodating different thicknesses of 2.5-inch storage devices. One manner of making the storage carrier accommodate different thicknesses of storage devices is the use of a revolving holding element that has several different length arms to bear upon, and securely locate, the storage device within the storage carrier.

BACKGROUND

Common 2.5-inch storage device thicknesses are 7 mm, 9.5 mm, and 15 mm, but current storage device carriers are suitable only for carrying storage devices having a 7 mm thickness. In order to accommodate different storage device thicknesses in one carrier, and hold the storage device in a predetermined position, the structure of storage device carriers must be adjusted.

SUMMARY

In one embodiment according to the present disclosure, a storage carrier and method is provided for carrying and holding a 2.5-inch storage device in a predetermined location, irrespective of the thickness of the storage device.

In another embodiment according to the present disclosure, a 2.5-inch storage device carrier is provided with two walls positioned orthogonal to each other, and on each wall is provided a storage device holding element, where the storage device holding element has three different height bearing surfaces.

In a still further embodiment according to the present disclosure, the storage device holding element comprises a short and a long arm, as well as a flattened surface, such that when the storage device holding element is rotated it can securely hold storage devices of different thicknesses. In order to prevent release of the storage device from the carrier by inadvertent rotation of the storage device holding element, the storage device holding element further incorporates two location holding points to prevent rotation of the storage device holding element. The rotatable storage device holding element can include a screw and spring to precisely position the storage device holding element in relation to the storage device.

DETAILED DESCRIPTION

Figure 1:
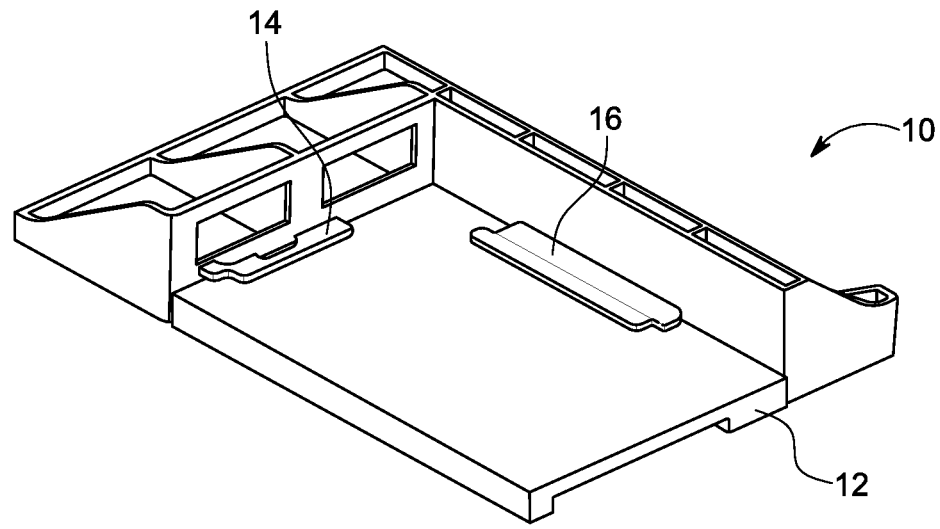
FIG. 1 (Prior Art) is a schematic, perspective view of an existing 2.5-inch storage carrier.

The present invention is described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1 illustrates a schematic, perspective view of a conventional 2.5-inch storage carrier 10 in which a 7 mm thick storage device 12 is inserted. Non-adjustable holders 14, 16, hold the 7 mm thick storage device in position. There is no mechanism in the storage device 10 of FIG. 1 to position and hold storage devices which are 9.5 mm or 15 mm in thickness.

Figure 2:
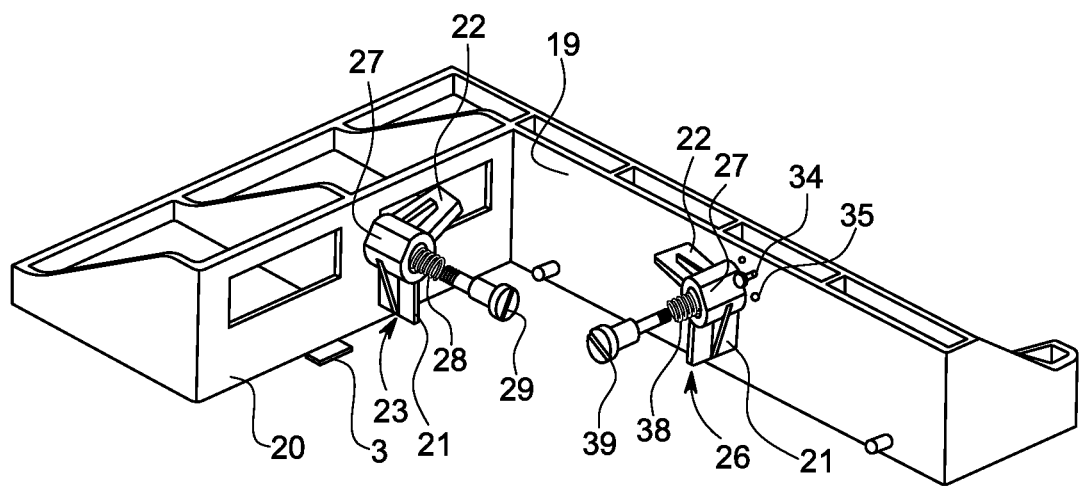
FIG. 2 is a schematic representation of two walls positioned orthogonal to each other, with each wall fitted with a storage device holding element that utilizes a spring and screw.

FIG. 2 illustrates a schematic representation of two walls 19, 20, positioned orthogonal to each other. Each wall 19, 20, is fitted with a storage device holding element 23, 26, and utilizes a spring 28 and screw 29 to position the storage device holding element 23, 26 in place. A similar spring 38 and screw 39 can be used to position each of storage device holding elements 23, 26 in place. Tab 3 locates the storage device to be inserted.

Figure 3:
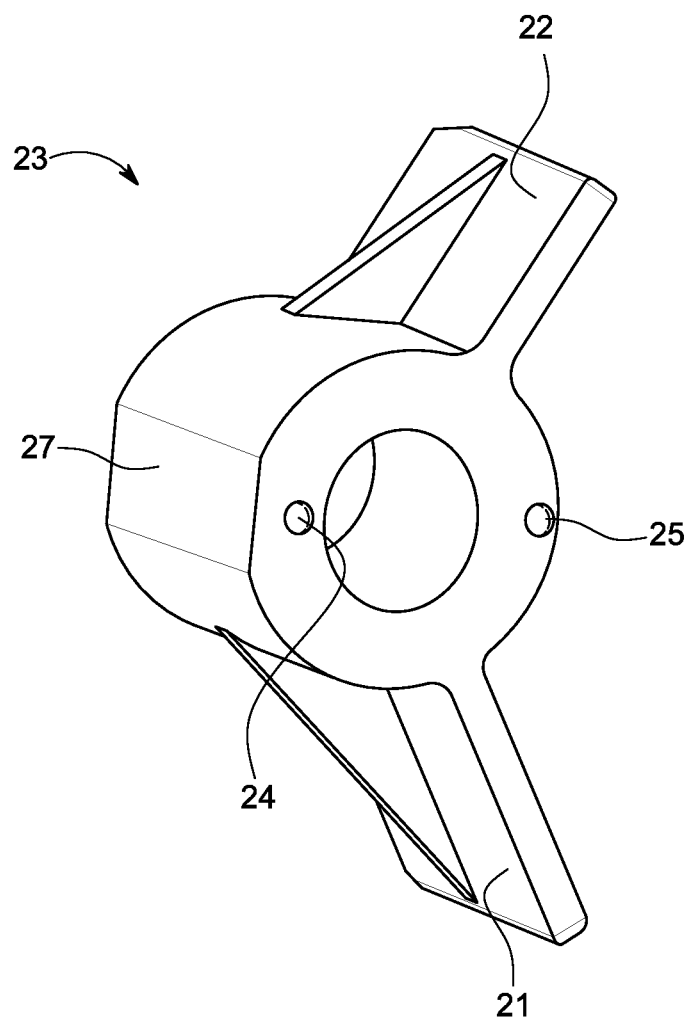
FIG. 3 is an enlarged view of the storage device holding element to show in detail, the short and long arms, as well as a flat surface, which securely hold storage devices of different thicknesses depending on the rotational position of the storage device holding element, and the two location points to prevent inadvertent rotation of the storage device holding element.

In FIG. 3, we will describe storage device holding element 23 in detail. However, as storage device holding elements 23 and 26 are identical in structure, the description of storage device 23 in detail will apply equally to storage device holding element 26. In FIG. 3, storage device holding element 23 is enlarged to show two location points 24, 25, which are illustrated in the drawings as protrusions. Location points 24, 25 cooperate with depressions 34, 35, in a wall 19 (or 20) (in FIG. 2) to maintain storage device holding element 23 in a fixed position, while the tension of the spring 28 (in FIG. 2) intermittently locks storage device holding element 23 in a fixed position of rotation. As can also be appreciated in FIG. 3, storage device holding element 23 is provided with 3 differing height bearing surfaces. These three different bearing surfaces can be described as a long arm 21, a short arm 22, and a flat bearing surface 27. These three differing height bearing surfaces act to retain the storage devices of different thicknesses securely within the storage carrier 30 (described below in FIGS. 4-6).

Figure 4:
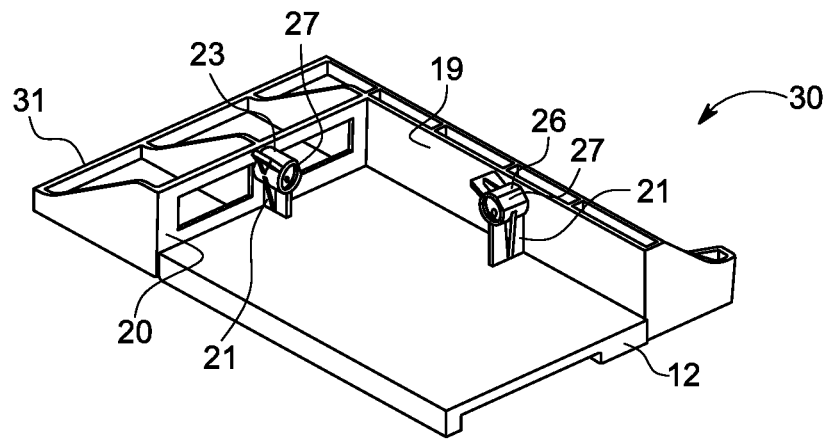
FIG. 4 is a schematic representation of the 2.5-inch storage device carrier according to the disclosure, with a 7 mm thick storage device held in place by the long arm of the storage device holding element.

Long arm bearing surface 21 is utilized when storage device 12 (in FIG. 1) of 7 mm thickness is placed in storage carrier 30, which consists of a main body 31 comprised of the two orthogonal walls 19, 20, as shown in FIG. 4.

Figure 5:
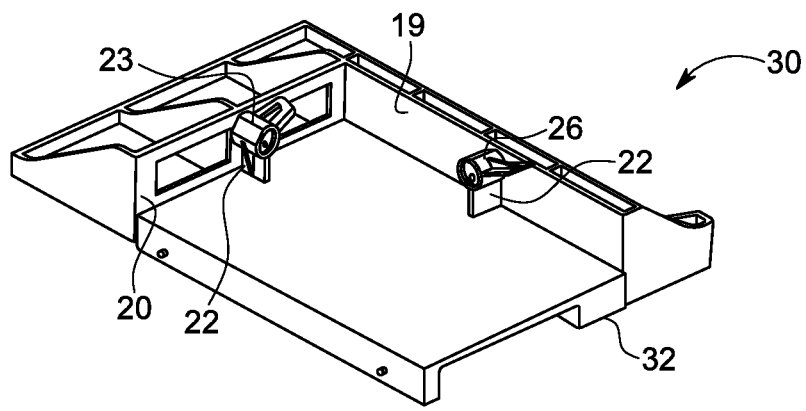
FIG. 5 is a schematic representation of the 2.5-inch storage device carrier according to the disclosure, with a 9.5 mm thick storage device held in place by the short arm of the storage device holding element.

Short arm bearing surface 22 is utilized when a storage device 32 of 9.5 mm thickness is placed in storage carrier 30, as shown in FIG. 5.

Figure 6:
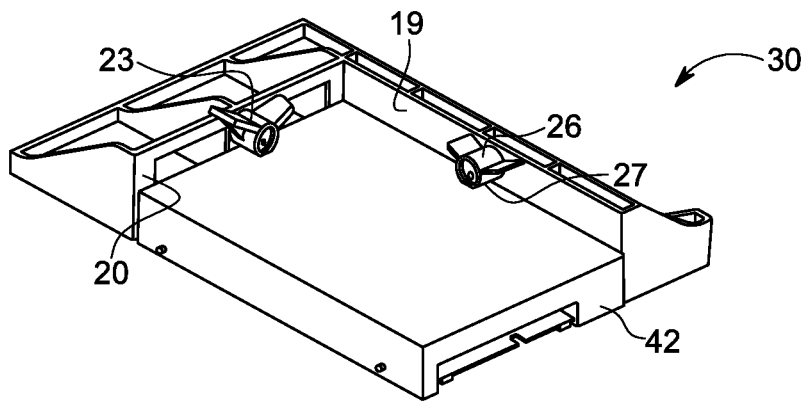
FIG. 6 is a schematic representation of the 2.5-inch storage device carrier according to the disclosure, with a 15 mm thick storage device held in place by the flat surface of the storage device holding element.

Flat bearing surface 27 is utilized when a storage device 42 of 15 mm thickness is placed in storage carrier 30, as shown in FIG. 6.

As shown in FIGS. 4-6, holding device 26 is identical to storage device holding element 23, and is provided with the same 3 differing height bearing surfaces for use in the same manner with storage devices 12, 32, and 42 of differing thicknesses. It is also possible to provide the storage device holding element 23 (or 26) with infinitely adjustable holding power by converting the differing heights of arm and flat bearing surface into a continuously curved cam-shape, so that any thickness within the 7 mm to 15 mm thickness range can be securely located with the storage carrier. Of course, different thicknesses can be accommodated in addition to, or in lieu of, the three specific thicknesses exemplified.

Thus, it should be apparent that one storage carrier 30 can accommodate three different thicknesses of storage devices 12, 32, and 42, without requiring extensive modification to the storage carrier itself. In the future, should storage devices be mandated in different thicknesses, all that would be required is the provision of new storage device holding elements with bearing surfaces to accommodate the differing thicknesses.

The terminology used herein is for the purpose of describing particular embodiments only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

We claim:

1. A storage device carrier adapted to locate storage devices of differing thickness comprising:
   a main body comprising two walls;
   a storage device holding element to hold storage devices of differing thicknesses in the storage device carrier; and
   at least two protruding location points on each of the storage device holding elements to intermittently limit rotation of the storage device holding element,
   wherein the storage device holding element comprises a rotatable element with multiple different bearing surfaces,
   wherein each of the two walls are provided with depressions for interacting with the protruding location points to intermittently limit rotation of the storage device holding element.

2. The storage device carrier of claim 1, wherein at least one storage device holding element is located on each of the two walls.

3. The storage device carrier of claim 1, wherein the storage device holding element comprises three different bearing surfaces.

4. The storage device carrier of claim 3, wherein one bearing surface comprises a long arm, a second bearing surface comprises a short arm, and the third bearing surface comprises a flat bearing surface.

5. The storage device carrier of claim 2, further comprising a spring and a screw to position each storage device holding element in place.

6. The storage device carrier of claim 1, further comprising at least one location point on the storage device holding element to intermittently lock the position of storage device holder.

7. The storage device carrier of claim 5, wherein there are multiple depressions in the wall to intermittently lock the position of storage device holding element.

8. The storage device carrier of claim 6, further comprising a spring and screw to bias the at least one location point into a depression on one of the walls of the storage device carrier.

9. The storage device carrier of claim 4, further comprising a 7 mm thick storage device and wherein the long arm is utilized to hold the 7 mm thick storage device in position in the storage device carrier.

10. The storage device carrier of claim 4, further comprising a 9.5 mm thick storage device and wherein the short arm is utilized to hold the 9.5 mm thick storage device in position in the storage device carrier.

11. The storage device carrier of claim 4, further comprising a 15 mm thick storage device, and wherein the flat bearing surface is utilized to hold the 15 mm thick storage device in position in the storage device carrier.

12. A storage device carrier for locating storage devices of differing thicknesses therein comprising:
    two walls; each of the walls provided with at least one storage device holding element;
    the storage device holding element comprising a rotatatable element comprising at least one long arm bearing surface, one short arm bearing surface, and one flat bearing surface for engagement with storage devices of differing thickness and
    at least two protruding location points on each of the storage device holding elements to intermittently limit rotation of the storage device holding element,
    wherein each of the two walls are provided with depressions for interacting with the protruding location points to intermittently limit rotation of the storage device holding element.

13. The storage device carrier of claim 12, wherein the walls are arranged orthogonal to one another.

14. The storage carrier of claim 12, further comprising a spring to bias the protruding location points into the depressions.

15. The storage carrier of claim 14, further comprising a screw to position each of the storage device holding elements on a respective wall.

16. A method of accommodating and locating storage devices of differing heights in a single storage device carrier comprising: providing a storage device carrier; placing a first storage device of a first thickness in the die storage device carrier; rotating the storage device until one of the multiple bearing surfaces comes into contact with the first storage device; removing the first storage device of a first thickness from the single storage device carrier, inserting a second storage device of a second thickness, which second thickness is different from the first thickness, and rotating the storage device holding element until one of the multiple bearing surfaces comes into contact with the second storage device; and removing the second storage device of a second thickness from the single storage device carrier, inserting a third storage device of a third thickness, which third thickness is different from each of the second thickness and from the first thickness, and rotating the storage device holding element until one of the multiple bearing surfaces comes into contact with the third storage device.

* * * * *